United States Patent
Curtis

(10) Patent No.: US 6,639,518 B1
(45) Date of Patent: Oct. 28, 2003

(54) AUTOMATED ALARM SETPOINT LEARNING IN AN ELECTRICAL METER

(75) Inventor: Larry E. Curtis, Murfreesboro, TN (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 10/277,430

(22) Filed: Oct. 22, 2002

(51) Int. Cl.$^7$ ................................................ G08B 21/00
(52) U.S. Cl. ........................ 340/635; 340/657; 340/660; 324/76.11
(58) Field of Search ................................ 340/635, 660, 340/661, 662, 663, 664, 657; 324/103 R, 133, 76.11, 76.15, 142; 361/90, 91, 92, 93, 94, 59, 45, 142; 702/60, 62, 64; 700/57, 292, 293

(56) References Cited

U.S. PATENT DOCUMENTS

| | | | | |
|---|---|---|---|---|
| 3,813,667 A | * | 5/1974 | Smith | 340/635 |
| 4,451,879 A | * | 5/1984 | Welch et al. | 364/181 |
| 5,486,998 A | * | 1/1996 | Corso | 363/152 |
| 6,198,403 B1 | * | 3/2001 | Dorrough | 340/635 |

OTHER PUBLICATIONS

Daish, Michael; "Full Disclosure Monitoring" Reliable Power Meters of Los Gatos, CA, Estimated Mar. 13, 1998, 6 pages.

"Reliable Power Meters: Technical Support," http://www.reliablemeters.com/html/support_library.html, Dec. 9, 2002, 2 pages.

Daish, Michael; Power Quality article—"Full Disclosure Monitoring Aims for Continuous Uptime," Reliable Power Meters of Los Gatos, CA, Feb. 1, 2001, 3 pages.

* cited by examiner

Primary Examiner—Anh V La
(74) Attorney, Agent, or Firm—Michael J. Femal; Larry I. Golden

(57) ABSTRACT

A circuit monitor monitors one or more metered values in an electrical circuit, and includes a system for selecting alarm setpoints based upon learned characteristics of normal operation of metered values. The circuit monitor includes a controller and a memory. The memory includes a test register of alarms selected to be part of a learning process. The controller includes summaries and characterizes the one or more metered values as histogram formatted data corresponding to metered values identified by a test register of alarms selected to be part of a learning process. The controller stores the histogram formatted data in the memory and organizes the stored data into a plurality of memory locations, each covering a fixed range of time duration. The controller selects setpoints which produce a minimum product of metered value multiplied by time duration for Over Alarms or a maximum product of metered value multiplied by time duration for Under Alarms.

30 Claims, 2 Drawing Sheets

AUTOMATED ALARM SETPOINT LEARNING IN AN ELECTRICAL METER

FIELD OF THE INVENTION

The present invention relates generally to power monitoring systems and, more particularly, to automated alarm setpoint learning in an electrical meter for use in a power monitoring system.

BACKGROUND OF THE INVENTION

Power monitoring (PMO) systems monitor the flow of electrical power in circuits through a plant or other facility. In the POWERLOGIC system manufactured by the instant assignee, Square D Company, circuit monitors and power meters are dedicated to power monitoring, while other compatible devices collect additional equipment information from protective relays, circuit breakers, transformer temperature controllers, and panelboards. Electrical data, such as current, power, energy, waveforms, and equipment status, is passed over a data network to one or more personal computers. The personal computers run power monitoring application software that retrieves, stores, organizes, and displays real-time circuit information in simple, usable formats. The information collected and stored in a power monitoring system helps operate a facility more efficiently. The quality of the data depends upon the accuracy of the instrumentation and the usability of the display formats.

The power meter can replace conventional metering devices such as ammeters, voltmeters, and watt-hour meters while providing other capabilities not offered by analog metering. The power meter's true rms readings reflect non-linear circuit loading more accurately than conventional analog metering devices. The power meter calculates the neutral current, which can assist in identifying overloaded neutrals due to either unbalanced single phase loads or triplen harmonics. Circuits can be closely monitored for available capacity by keeping track of the peak average demand current.

Manual selection of appropriate magnitude and duration alarm setpoints for the numerous electrical parameters monitored by the CM4000 Circuit Monitor requires experience and expertise and can be time-consuming. This new system automates this process by collecting the needed data and applying a heuristic analysis to select appropriate setpoints.

Reliable Power Meters of Los Gatos, Calif. has a product called "Full Disclosure Monitoring" which approaches the issue of automating the alarming process by not selecting setpoints.

SUMMARY AND OBJECTS OF THE INVENTION

Briefly, in accordance with the foregoing, a circuit monitor for monitoring one or more metered values in an electrical circuit, including a system for selecting alarm setpoints based upon learned characteristics of normal operation of metered values, comprises a controller, a memory, the memory including a test register of alarms selected to be part of a learning process, the controller includes means for summarizing and characterizing the one or more metered values as histogram formatted data corresponding to metered values identified by a test register of alarms selected to be part is of a learning process, means for storing the histogram formatted data in the memory; means for organizing the stored data into a plurality of memory locations, each covering a fixed range of time duration; and means for selecting setpoints which produce a minimum product of metered value multiplied by time duration for Over Alarms, i.e., a metered value is above an upper limit setpoint, and a maximum product of metered value multiplied by time duration for Under Alarms, i.e., a metered value is below a lower limit setpoint.

In accordance with another aspect of the invention, a method of automated alarm setpoint learning in an electrical meter comprises summarizing and characterizing one or more metered values as histogram formatted data corresponding to metered values identified by a test register of alarms selected to be part of a learning process, storing said histogram formatted data in said memory, organizing said stored data into a plurality of memory locations, each covering a fixed range of time duration, and selecting setpoints which produce a minimum product of metered value multiplied by time duration for Over Alarms and a maximum product of metered value multiplied by time duration for Under Alarms.

In accordance with another aspect of the invention, a system for setting alarm points for metered values comprises means for summarizing and characterizing one or more metered values as histogram formatted data corresponding to metered values identified by a test register of alarms selected to be part of a learning process, means for storing said histogram formatted data in said memory, means for organizing said stored data into a plurality of memory locations, each covering a fixed range of time duration, and means for selecting setpoints which produce a minimum product of metered value multiplied by time duration for Over Alarms and a maximum product of metered value multiplied by time duration for Under Alarms.

DETAILED DESCRIPTION OF THE ILLUSTRATED EMBODIMENT

Figure 1:
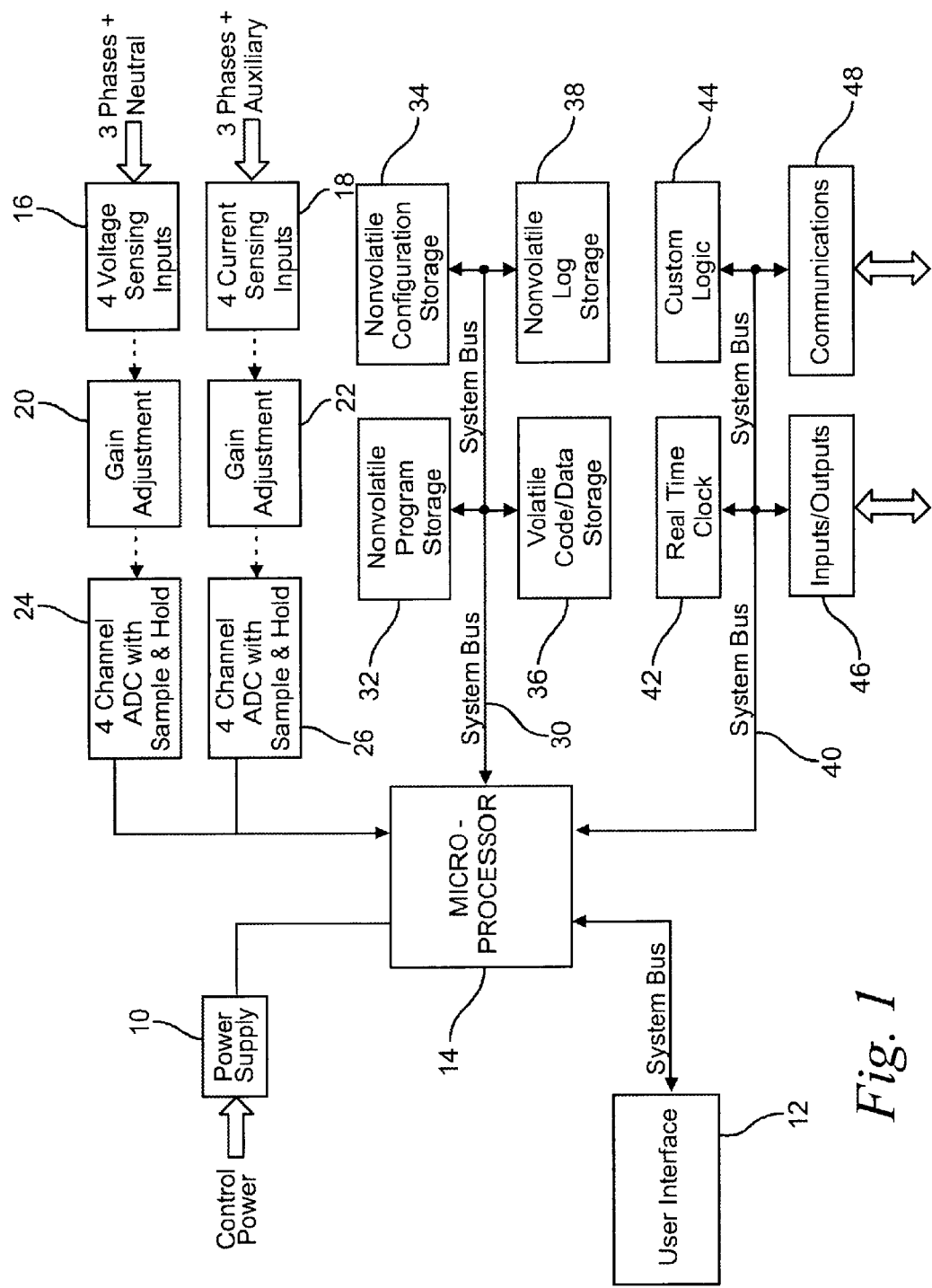
FIG. 1 is a functional block diagram of a power monitor.
Figure 2:
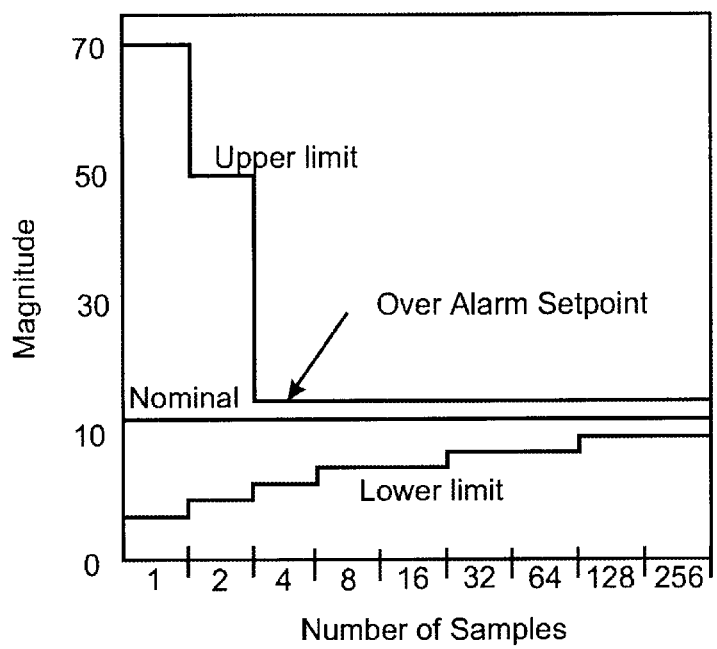
FIGS. 2 and 3 are graphs, illustrating two examples of setpoint learning in accordance with the invention.
Figure 3:
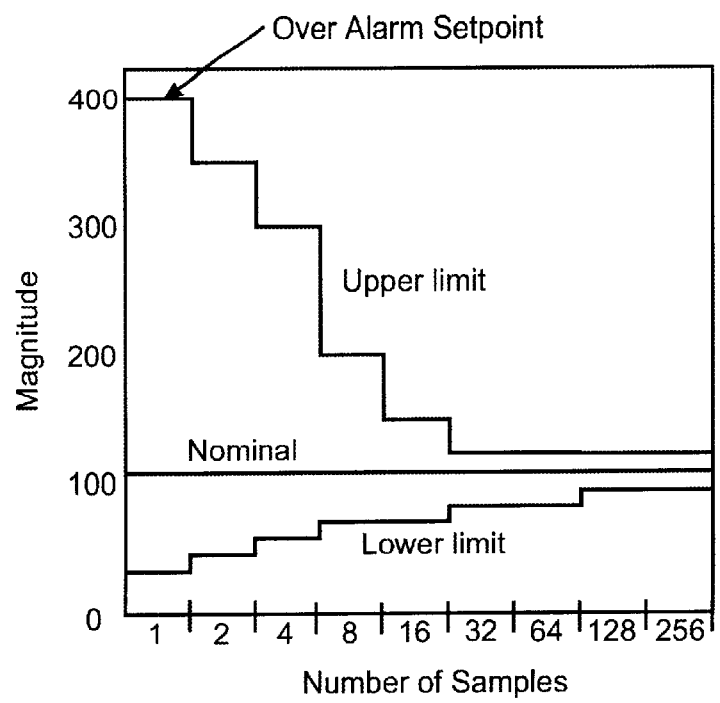

This implementation optimizes the selection of magnitude and duration alarm setpoints for electrical parameters based on observations made during a period of normal power system operation. This system provides a level of user-configurability not found in other systems. The use of a histogram with 10 bins, each representing a fixed time duration, for data collection and summarization is believed to be unique.

The figure shows a block diagram, in functional form, of a typical power monitoring device or power monitor in connection with which the invention may be utilized. This power monitor could be, for example a Square D Company product, such as products designated Circuit Monitor 4000 or 4000T, Circuit Monitor 3000 Series and/or Power Meter 800 Series Meters.

Briefly, the power monitor shown in the figure includes a power supply 10 and user interface 12 both of which operatively connect with a microprocessor or controller 14. It is the controller or microprocessor 14 which controls and/or performs the major processes involved in power monitoring, and, in turn, performs the majority of the operations for automated alarm setpoint learning in accordance with the invention, as is more fully described below.

In this regard, the microprocessor may be coupled to receive a number of channels of inputs from metered values, for example, a number of voltage sensing inputs 16 and a number of current sensing inputs 18, which may come from one or more three-phase lines to be monitored, including a neutral and/or auxiliary lead. These sensing inputs 16 and 18 in turn are coupled to the microprocessor 14 by suitable gain adjustments 20 and 22 and four-channel analog-to-digital converters 24 and 26 with sample-and-hold capabilities.

One or more memory components are coupled with the microprocessor via a system bus 30. These components may include nonvolatile program storage 32, nonvolatile configuration storage 34, volatile code/data storage 36 and/or nonvolatile log storage 38. A further system bus 40 may also be used to couple the microprocessor 14 with a real time clock 42 and custom logic 44, if and as required for a particular application. Various inputs and outputs 46 and communications nodes 48 may also be provided if desired in a particular monitoring application. These inputs and outputs may communicate with other similar monitors or with a master computer which polls or otherwise receives data from a number of monitors. The communications ports or devices 48 may accommodate various communications protocols such as RS232, RS-485, or ethernet.

Implementation of Alarm Setpoint Learning

A system is provided enabling the Circuit Monitor to learn the characteristics of normal operation of metered values and select alarm setpoints based on this data.

The Circuit Monitor summarizes and characterizes metered values in histogram format. Histogram data is collected only for metered values identified by the Test Register of alarms selected to be part of the learning process. This data is stored in memory (e.g., on a Disk-On-Chip) once per hour so no more than an hour of data is lost if the meter resets.

In order to minimize the amount of data collected and stored on the Disk-On-Chip, the data is organized into 10 bins, each covering a fixed range of time duration as follows:

Alarms or the maximum product of metered value multiplied by time duration for Under Alarms. The following two examples illustrate:

| Bin | Magnitude (M) | Duration (D) | M * D |
| --- | --- | --- | --- |
| 1 | 400 | 1 | 400 |
| 2 | 350 | 3 | 1050 |
| 3 | 300 | 5 | 1500 |
| 4 | 200 | 9 | 1800 |
| 5 | 150 | 17 | 2250 |
| 6 | 125 | 33 | 4125 |
| 7 | 125 | 65 | 8125 |
| 8 | 125 | 129 | 16125 |
| 9 | 125 | 257 | 32125 |
| 10 | 125 | 258 | 32250 |

Since the minimum M*D is 400, the setpoint of 400 with a time delay of 1 is chosen.

| Bin | Magnitude (M) | Duration (D) | M * D |
| --- | --- | --- | --- |
| 1 | 70 | 1 | 70 |
| 2 | 50 | 3 | 150 |
| 3 | 12.5 | 5 | 62.5 |
| 4 | 12.5 | 9 | 112.5 |
| 5 | 12.5 | 17 | 212.5 |
| 6 | 12.5 | 33 | 412.5 |
| 7 | 12.5 | 65 | 812.5 |
| 8 | 12.5 | 129 | 1612.5 |
| 9 | 12.5 | 257 | 3212.5 |
| 10 | 12.5 | 258 | 3225 |

Since the minimum M*D is 62.5, the setpoint of 12.5 with a time delay of 5 is chosen.

| Bin | Consecutive Samples Value Appeared | Delay Setpoint | Maximum Value (Over Alarm Setpoint) | Minimum Value (Under Alarm Setpoint) |
| --- | --- | --- | --- | --- |
| 1 | 1 | 1 | The maximum value that appeared at least one time. This value would equal the maximum 1-second metered value during the learning period plus the deadband. | The minimum value that appeared at least one time. This value would equal the minimum 1-second metered value during the learning period minus the deadband. |
| 2 | 2 | 3 | | |
| 3 | 3–4 | 5 | | |
| 4 | 5–8 | 9 | | |
| 5 | 9–16 | 17 | | |
| 6 | 17–32 | 33 | | |
| 7 | 33–64 | 65 | | |
| 8 | 65–128 | 129 | | |
| 9 | 129–256 | 257 | | |
| 10 | 257 or more | 258 | | |

Working in powers of 2 provides an efficient method to cover a broad range of time delays within the order of magnitude most often used for alarm setpoints.

The learned setpoints are updated at an interval of 1 second for all alarm types.

Setpoints are selected which produce the minimum product of metered value multiplied by time duration for Over The dropout value is set at ½ of the deadband above the nominal value used to set the pickup value. The dropout time delay is always set at 0.

Operation and User Interface

The user must select from the following modes for each alarm. The user must then turn ON Learn Mode. After a representative period of "normal" operation the user may manually turn OFF Learn Mode. The user may also specify a time period to learn and the action to take at the end of the learning period.

The following alarm enable settings are used:
1. 0x00 Disabled, not learning
2. 0xaa Disabled, learning
3. 0xcc Enabled with fixed histogram setpoints, not learning
4. 0xdd Enabled with dynamic (learned) setpoints while learning
5. 0xee Enabled with fixed setpoints, learning
6. 0xff Enabled with fixed setpoints, not learning When learning, histogram data is collected for metered data for each alarm in learn mode. A deadband is applied to the metered value to provide a setpoint setting at a specified percentage above (or below) the metered value. The learned setpoints are determined from the histogram data at the time interval specified by the user.

Global Alarm Setpoint Learn Mode Configuration and Control Registers
1. 10060—Learn Mode Start/Stop (0=stop(default), 1=start)
2. 10061—Learn Mode Duration in days (0–365, default= 0=continuous)
3. 10062—Learn Mode Duration without setpoint change to be considered ONE (1–30, default=7 days)
4. 10063—Action to take at end of Learning Period
    a. Hold learned setpoints for review (default)
    b. Install learned setpoints
5. 10064—Deadband to apply to metered values (1–99%, similar to % relative setting)
6. 10065—Time interval for updating dynamic setpoints (1–1440 minutes, default=60)
7. 10066—Control Switch for Global Alarm Enable Setting (on/off=default)
8. 10067—Global Alarm Enable Setting Global Alarm Setpoint Learn Mode Status Registers
1. 10070—Learn Mode Status (0=off, 1=on, 2=done)
2. 10071—Learn Mode Elapsed Time—days
3. 10072—Learn Mode Elapsed Time—hours
4. 10073—Learn Mode Elapsed Time—minutes
5. 10074—Learn Mode Elapsed Time without setpoint change—days
6. 10075—Learn Mode Elapsed Time without setpoint change—hours
7. 10076—Learn Mode Elapsed Time without setpoint change—minutes
8. 10077—Reserved (2registers)

Alarm Setpoint Learn Mode Data Registers
1. 10079—Alarm to display (User enters number of alarm for which to display data)
2. 10080—Test Register Number of alarm specified above
3. 10081—Present Value of Test Register Metered Value
4. 10082—Present Learned Setpoints (4 registers)
5. 10086—Present Setpoints in Service (4 registers)
6. 10090—Present Histogram data (20 registers)
7. 10110—Reserved (4 registers)

Alarm Setpoint Learn Mode Histogram Change Registers
1. 16971—Upper Limit Change Bitmap (9 registers)
2. 16981—Lower Limit Change Bitmap (9 registers)
3. 16991—Either Limit Change Bitmap (9 registers)

By leaving an alarm in learn mode, the meter continues to collect histogram data. When a change is made to the histogram, a bit is set in the above bitmaps for 1 second. The user could configure a Binary Alarm on that bit and thereby create, in effect, a 10-level alarm. In enable mode 0xcc, the histogram is not changed but the bitmap is still updated when a value falls outside of the present histogram.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A circuit monitor for monitoring one or more metered values in an electrical circuit, said circuit monitor including a system for selecting alarm setpoints based upon learned characteristics of normal operation of metered values, said circuit monitor comprising:
   a controller;
   a memory;
   said memory including a test register of alarms selected to be part of a learning process;
   said controller including:
      means for summarizing and characterizing said one or more metered values as histogram formatted data corresponding to metered values identified by a test register of alarms selected to be part of a learning process;
      means for storing said histogram formatted data in said memory;
      means for organizing said stored data into a plurality of memory locations, each covering a fixed range of time duration; and
      means for selecting setpoints which produce a minimum product of metered value multiplied by time duration for Over Alarms or a maximum product of metered value multiplied by time duration from Under Alarms.

2. The circuit monitor of claim 1 wherein said memory comprises a disk-on-chip.

3. The circuit monitor of claim 1 wherein said means for organizing includes means for organizing said ranges of time duration in powers of two.

4. The circuit monitor of claim 1, said controller further including means for updating the selected setpoints at predetermined time intervals.

5. The circuit monitor of claim 1 wherein said controller further includes means for setting a dropout value at a predetermined proportion of a deadband above a nominal value used to set a pickup value.

6. The circuit monitor of claim 1 wherein said controller further includes user-activatable means for selecting from among one or more modes for each alarm setpoint, including an ON learn mode and an OFF learn mode.

7. The circuit monitor of claim 6 and said controller further including user activatable means for specifying a learning time period for a learning mode and an action to take at the end of said learning time period.

8. The circuit monitor of claim 1 wherein said means for summarizing and characterizing, said means for storing and said means for organizing are provided for metered data for each of a plurality of alarm setpoints.

9. The circuit monitor of claim 1 and said controller further including means for applying a deadband to metered values to provide a setpoint setting at a specified percentage above or below the metered value.

10. The circuit monitor of claim 1, said controller further including means for configuring an alarm, so as to create, in effect, a multiple-level alarm having levels corresponding to the number of memory locations.

11. A method of automated alarm setpoint learning in an electrical meter, said method comprising:
   summarizing and characterizing one or more metered values as histogram formatted data corresponding to metered values identified by a test register of alarms selected to be part of a learning process;

storing said histogram formatted data in a memory;

organizing said stored data into a plurality of memory locations, each covering a fixed range of time duration; and selecting setpoints which produce a minimum product of metered value multiplied by time duration for Over Alarms or a maximum product of metered value multiplied by time duration for Under Alarms.

12. The method of claim 11 wherein said storing comprises storing in a disk-on-chip.

13. The method of claim 11 wherein said organizing includes organizing said ranges of time duration in powers of two.

14. The method of claim 11 and further including updating the selected setpoints at predetermined time intervals.

15. The method of claim 11 and further including setting a dropout value at a predetermined proportion of a deadband above a nominal value used to set a pickup value.

16. The method of claim 11 and further including selecting from among one or more modes for each alarm setpoint, including an ON learn mode and an OFF learn mode.

17. The method of claim 16 and further including specifying a learning time period for learning mode and specifying an action to take at the end of said learning time period.

18. The method of claim 11 wherein said summarizing and characterizing, said storing and said organizing are carried out for metered data for each of a plurality of alarm setpoints.

19. The method of claim 11 and further including applying a deadband to metered values to provide a setpoint setting at a specified percentage above or below the metered value.

20. The method of claim 11 and further including configuring an alarm, so as to create, in effect, a multiple-level alarm having multiple levels corresponding to the number of memory locations.

21. A system for setting alarm points for metered values, said system comprising:

means for summarizing and characterizing said one or more metered values as histogram formatted data corresponding to metered values identified by a test register of alarms selected to be part of a learning process;

means for storing said histogram formatted data in a memory;

means for organizing said stored data into a plurality of memory locations, each covering a fixed range of time duration; and means for selecting setpoints which produce a minimum product of metered value multiplied by time duration for Over Alarms or a maximum product of metered value multiplied by time duration for Under Alarms.

22. The system of claim 21 wherein said memory comprises a disk-on-chip.

23. The system of claim 21 wherein said means for organizing includes means for organizing said ranges of time duration in powers of two.

24. The system of claim 21, further including means for updating the selected setpoints at predetermined time intervals.

25. The system of claim 21 further including means for setting a dropout value at a predetermined proportion of a deadband above a nominal value used to set a pickup value.

26. The system of claim 21 further including user-activatable means for selecting from among one or more modes for each alarm setpoint, including an ON learn mode and an OFF learn mode.

27. The system of claim 26 and further including user activatable means for specifying a time period for learning mode and an action to take at the end of said time period.

28. The system of claim 21 wherein said means for summarizing and characterizing, said means for storing and said means for organizing are provided for metered data for each of a plurality of alarm setpoints.

29. The system of claim 21 and further including means for applying a deadband to metered values to provide a setpoint setting at a specified percentage above or below the metered value.

30. The system of claim 21, further including means for configuring an alarm, so as to create, in effect, a multiple-level alarm, having multiple levels corresponding to the number of storage locations.

* * * * *